United States Patent
Kim et al.

(10) Patent No.: US 11,923,042 B2
(45) Date of Patent: Mar. 5, 2024

(54) APPARATUS, MEMORY DEVICE, AND METHOD REDUCING CLOCK TRAINING TIME

(71) Applicant: SAMSUNG ELECTRONICS CO., LTD., Suwon-si (KR)

(72) Inventors: Sangwoo Kim, Seoul (KR); Younghoon Son, Yongin-si (KR); Seongheon Yu, Yongin-si (KR); Joungyeal Kim, Yongin-si (KR); Chulung Kim, Seou (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 17/581,445

(22) Filed: Jan. 21, 2022

(65) Prior Publication Data

US 2023/0005515 A1  Jan. 5, 2023

(30) Foreign Application Priority Data

Jul. 2, 2021  (KR) .......................... 10-2021-0087398

(51) Int. Cl.
  *G11C 7/22*  (2006.01)
  *G11C 7/10*  (2006.01)
  (Continued)

(52) U.S. Cl.
  CPC ............ *G11C 7/222* (2013.01); *G11C 7/1069* (2013.01); *G11C 7/1096* (2013.01); *G11C 29/12015* (2013.01); *G11C 29/46* (2013.01)

(58) Field of Classification Search
  CPC ..... G11C 7/222; G11C 7/1069; G11C 7/1096; G11C 29/12015; G11C 29/46
  See application file for complete search history.

(56) References Cited

U.S. PATENT DOCUMENTS 6,181,178 B1   1/2001  Choi
6,238,186 B1   5/2001  Sato et al.
(Continued)

FOREIGN PATENT DOCUMENTS

KR   10-0281898      2/2001
KR   10-2019-0093102  8/2019
KR   10-2021-0000740  1/2021

OTHER PUBLICATIONS

European Search Report dated Feb. 6, 2023, cited in EP Patent Application No. 22181778.6.

*Primary Examiner* — Vanthu T Nguyen
(74) *Attorney, Agent, or Firm* — Fish & Richardson P.C.

(57) ABSTRACT

An apparatus includes a host and a memory device connected to the host through a bus. The bus is used to communicate a data clock controlling data write timing during a write operation executed by the memory device and a read clock controlling data read timing during a read operation executed by the memory device. The memory device performs first duty cycle monitoring that monitors a duty cycle of the data clock, generates a first result, and provides a timing-adjusted data clock, performs second duty cycle monitoring that monitors a duty cycle of the read clock, generates a second result, and provides a timing-adjusted read clock, calculates an offset of the read clock based on the timing-adjusted data clock, the result and the second result, and corrects a duty error of the read clock using a read clock offset code derived from the offset of the read clock.

20 Claims, 14 Drawing Sheets

(51) Int. Cl.
*G11C 29/12* (2006.01)
*G11C 29/46* (2006.01)

(56) References Cited

U.S. PATENT DOCUMENTS

| | | |
|---|---|---|
| 10,600,459 B2 | 3/2020 | Kim |
| 10,714,162 B2 * | 7/2020 | Koh .......................... G11C 8/18 |
| 10,734,983 B1 | 8/2020 | Jeter et al. |
| 10,923,175 B2 * | 2/2021 | Moon ................... G11C 11/409 |
| 2012/0262998 A1 | 10/2012 | Kizer et al. |
| 2019/0237127 A1 | 8/2019 | Moon et al. |
| 2020/0133542 A1 | 4/2020 | Kim et al. |
| 2020/0160902 A1 | 5/2020 | Gans |

* cited by examiner

FIG. 5

| Function | Register Type | Operand | Data | Note |
|---|---|---|---|---|
| Duty cycle result for upper byte when DCM Flip=1 (DCMU1) | Read | OP[5] | 0b: High duty cycle <50% for upper byte | |
| | | | 1b: High duty cycle ≥50% for upper byte | |
| Duty cycle result for upper byte when DCM Flip=0 (DCMU0) | | OP[4] | 0b: High duty cycle <50% for upper byte | |
| | | | 1b: High duty cycle ≥50% for upper byte | |
| Duty cycle result for lower byte when DCM Flip=1 (DCML1) | | OP[3] | 0b: High duty cycle <50% for lower byte | |
| | | | 1b: High duty cycle ≥50% for lower byte | |
| Duty cycle result for lower byte when DCM Flip=0 (DCML0) | | OP[2] | 0b: High duty cycle <50% for lower byte | |
| | | | 1b: High duty cycle ≥50% for lower byte | |
| Flip inputs to cancel offset (DCM_Flip) | Write | OP[1] | 0b:Non-Flip | |
| | | | 1b:Flip | |
| DCM_Start/Stop | | OP[0] | 0b:Stop | |
| | | | 1b:Start | |

FIG. 7

| OP[3:0] | DCA Code (Step) |
|---------|-----------------|
| 1111 | +7 |
| 1110 | +6 |
| 1101 | +5 |
| 1100 | +4 |
| 1011 | +3 |
| 1010 | +2 |
| 1001 | +1 |
| 0000 | 0 |
| 0001 | −1 |
| 0010 | −2 |
| 0011 | −3 |
| 0100 | −4 |
| 0101 | −5 |
| 0110 | −6 |
| 0111 | −7 |

FIG. 11

DCA/DCM1 result

| DCA Code | -7 | -6 | -5 | -4 | -3 | -2 | -1 | 0 | +1 | +2 | +3 | +4 | +5 | +6 | +7 |
|---|---|---|---|---|---|---|---|---|---|---|---|---|---|---|---|
| Non-Flip | 0 | 0 | 0 | 0 | 0 | 0 | 1 | 1 | 1 | 1 | 1 | 1 | 1 | 1 | 1 |
| Flip | 0 | 0 | 0 | 0 | 0 | 0 | 0 | 0 | 0 | 1 | 1 | 1 | 1 | 1 | 1 |

1110
1111

DCA/DCM2 result

| DCA Code | -7 | -6 | -5 | -4 | -3 | -2 | -1 | 0 | +1 | +2 | +3 | +4 | +5 | +6 | +7 |
|---|---|---|---|---|---|---|---|---|---|---|---|---|---|---|---|
| Non-Flip | 0 | 0 | 0 | 1 | 1 | 1 | 1 | 1 | 1 | 1 | 1 | 1 | 1 | 1 | 1 |
| Flip | 0 | 0 | 0 | 0 | 0 | 0 | 1 | 1 | 0 | 0 | 0 | 0 | 1 | 1 | 1 |

1120
1121

RDQS_OFFSET

| DCA Code | -7 | -6 | -5 | -4 | -3 | -2 | -1 | 0 | +1 | +2 | +3 | +4 | +5 | +6 | +7 |
|---|---|---|---|---|---|---|---|---|---|---|---|---|---|---|---|
| Non-Flip | 0 | 0 | 0 | 1 | 1 | 1 | 0 | 0 | 0 | 0 | 0 | 0 | 0 | 0 | 0 |
| Flip | 0 | 0 | 0 | 0 | 0 | 0 | 0 | 0 | 0 | 1 | 1 | 1 | 0 | 0 | 0 |

1130
1131

APPARATUS, MEMORY DEVICE, AND METHOD REDUCING CLOCK TRAINING TIME

CROSS-REFERENCE TO RELATED APPLICATION

This application claims priority under 35 U.S.C. § 119 to Korean Patent Application No. 10-2021-0087398 filed on Jul. 2, 2021 in the Korean Intellectual Property Office, the subject matter of which is hereby incorporated by reference in its entirety.

BACKGROUND

The inventive concept relates generally to apparatuses, memory devices, and operating methods capable of reducing a clock training time by simultaneously performing duty cycle training on a data clock and duty cycle training on a read clock.

Contemporary and emerging electronic systems facing continuing demands for faster operating speeds, greater data capacity and reduced power consumption. Accordingly, constituent semiconductor devices (e.g., logic and/or memory devices) should provide faster data access, expanded data bandwidth, increased data storage capabilities and/or reduced power consumption.

A semiconductor memory device (hereafter generically, a "memory device") typically operates in response to one or more command(s), address(es), data and/or control signal(s) including clock signal(s) (hereafter singularly of collectively, Command & Control/Address/Data or "CAD signals:). Various CAD signals may be provided by a memory controller.

Respective command(s) may be used to control the operation of a memory device. That is, the memory device perform one or more data access operations in response to a corresponding command. For example, a read command may invoke execution of a read operation that retrieves "read data" from the memory device, and a write (or program) command may invoke a write (or program) operation that stores "write data" in the memory device. In this regard, read data associated with a read command or write data associated with a write command may be exchanged between a memory controller and the memory device in relation to defined timings constraints. Thus, the successful execution of various data access operations by the memory device requires accurate control over the timing of data reception and/or data transmission (hereafter, "data communications").

Certain externally-provided clocks (hereafter, "external clocks") such as a system clock and/or a data clock may be provided to the memory device by the memory controller. The system clock may be used to control the timing of commands and addresses, whereas the data clock may be used to control the timing of certain data communications (e.g., write data being provided to the memory device). Additionally, the memory device may provide a read clock to the memory controller in order to control the timing of other data communications (e.g., read data being provided from the memory device to the memory controller). A frequency of a data clock may be greater than a frequency of a system clock. For example, a frequency of a data clock may be an integer multiple of a frequency of a system clock.

An external clock provided to the memory device may be used to generate one or more internal clock(s) used to control the timing(s) of various internal circuits during operation of the memory device. The interrelated timing(s) of these internal circuits is critical to the successful execution of data access operations. Accordingly, any deviation in the functioning of an internal clock may cause a malfunction (or performance departure) in the memory device. One example of a common deviation in clock timing is duty cycle distortion (e.g., a deviation from a defined 50% duty cycle).

Further complicating concerns regarding correct data access timing (e.g., proper clock operation), a memory controller and a memory device arranged in a memory system may have been manufactured under very different (e.g., different semiconductor manufacturing processes, temperatures, voltages, etc.). Accordingly, the memory controller and the memory device may exhibit differing operating characteristics, such as operating speed, power consumption, etc. In view of these possibilities, it is typical to "train" the memory controller in relation to the actual performance of the memory device in order to adjust, as necessary, the duty cycle of a data clock (e.g., a data clock defined to have an ideal 50% duty cycle). However, after performing data clock training, the memory controller may additionally require training in relation to the read clock, wherein the duty cycle of the read clock may be adjusted in relation to the actual performance of the memory device (e.g., a read clock defined to have an ideal 50% duty cycle).

Unfortunately, sophisticated data clock training and read clock training performed between the memory controller and the memory device may involve sequentially and repeatedly performing various operations such as adjusting, changing, and/or correcting a code under the control of a specialized training program, and this approach may involve considerable time and system resource consumption.

SUMMARY

Embodiments of the inventive concept provide apparatuses, memory devices and methods of operation that markedly reduce the time required to perform data clock and read clock training.

According to an aspect of the inventive concept, a memory device may include; a first signal pin configured to receive a data clock, a second signal pin configured to transmit a read clock and a data clock circuit receiving the data clock and configured to perform first duty cycle monitoring that monitors a duty cycle of the data clock, generates a first result, and provides a timing-adjusted data clock in response to the first duty cycle monitoring, perform second duty cycle monitoring that monitors a duty cycle of the read clock, generates a second result, and provides a timing-adjusted read clock in response to the second duty cycle monitoring, calculate an offset of the read clock in response to the timing-adjusted data clock, the first result and the second result, and correct a duty error of the read clock using a read clock offset code derived in relation to the offset of the read clock, wherein the data clock controls data write timing during a write operation executed by the memory device, the data clock controls data read timing during a read operation executed by the memory device, and the read clock controls communication of read data from the memory device.

According to an aspect of the inventive concept, an apparatus may include; a host and a memory device connected to the host through a bus, wherein the bus includes a clock bus portion configured to communicate a data clock controlling data write timing during a write operation executed by the memory device, and a read clock controlling data read timing during a read operation executed by the memory device, and the memory device is configured to perform first duty cycle monitoring that monitors a duty cycle of the data clock, generates a first result, and provides a timing-adjusted data clock, perform second duty cycle monitoring that monitors a duty cycle of the read clock, generates a second result, and provides a timing-adjusted read clock, calculate an offset of the read clock based on the timing-adjusted data clock, the result and the second result, and correct a duty error of the read clock using a read clock offset code derived from the offset of the read clock.

According to an aspect of the inventive concept, an apparatus may include; a memory controller and a memory device connected to the memory controller by a bus, wherein the memory device receives a data clock from the memory controller via the bus and the memory controller receives a read clock from the memory device via the bus, the data clock controls data write timing during a write operation executed by the memory device and the read clock controls read timing during a read operation executed by the memory device, the memory device is configured to perform first duty cycle monitoring that monitors a duty cycle of the data clock and generates a first result, provide a timing-adjusted data clock in response to the first duty cycle monitoring, generate a read clock offset code in response to the first result, and correct a duty error of the read clock using the read clock offset code, and the read clock offset code indicates a difference between a first propagation delay associated with a write data path used to communicate data from the memory controller to the memory device and a second propagation delay associated with a read data path used to communicate data from the memory device to the memory controller.

According to an aspect of the inventive concept, a method may include; performing first duty cycle monitoring that monitors a duty cycle of a data clock to provide a first result, providing a timing-adjusted data clock in response to the first duty cycle monitoring, wherein the data clock controls data write timing during a write operation executed by a memory device, performing second duty cycle monitoring that monitors a duty cycle of a read clock to provide a second result, providing a timing-adjusted read clock in response to the second duty cycle monitoring, wherein the read clock controls data read timing during a read operation executed by the memory device, calculating an offset of the read clock in response to the first result and the second result, generating a read clock offset code in response to the offset of the read clock, and correcting a duty error of the read clock using the read clock offset code.

According to an aspect of the inventive concept, a method may include; performing first duty cycle monitoring that monitors a duty cycle of a data clock and generating a first result;

providing a timing-adjusted data clock in response to the first duty cycle monitoring, wherein the data clock controls data write timing during a write operation executed by a memory device, and correcting a duty error of a read clock with respect to the timing-adjusted data clock using a read clock offset code stored in the memory device, wherein the read clock controls data read timing during a read operation executed by the memory device, wherein the read clock offset code indicates a difference between a first propagation delay associated with a write data path used to communicate data to the memory device and a second propagation delay associated with a read data path used to communicate data from the memory device.

BRIEF DESCRIPTION OF THE DRAWINGS

The making and use of the inventive concept may be more clearly understood upon consideration of the following detailed description together with the accompanying drawings in which:

FIGS. 4 and 5 are respective tables listing certain data clock monitoring (DCM) features according to embodiments of the inventive concept;

FIGS. 6, 7 and 8 are diagrams further illustrating exemplary DCA features according to embodiments of the inventive concept;

FIGS. 9, 10 and 11 are respective diagrams illustrating in one example a method of clock training according to embodiments of the inventive concept;

DETAILED DESCRIPTION

Throughout the written description and drawings, like reference numbers and labels are used to denote like or similar elements, components, features and/or method steps.

Figure (FIG. 1) is a block diagram illustrating an apparatus 100 according to embodiments of the inventive concept.

Figure 1:
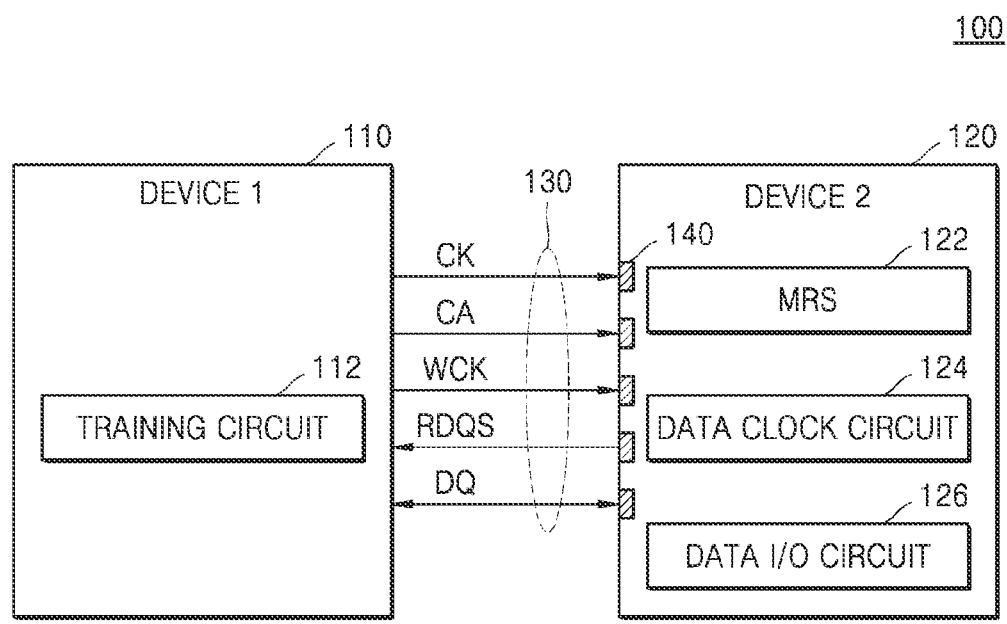
FIG. 1 is a block diagram illustrating an apparatus according to embodiments of the inventive concept.

Referring to FIG. 1, the apparatus 100 may generally include a first device 110 and a second device 120. In this regard, the apparatus 100 may be variously implemented to be a personal computer (PC), a television (TV), a household appliance, a vehicle, a mobile electronic device (e.g., a laptop computer, a mobile phone, a smartphone, a tablet personal computer (PC), a personal digital assistant (PDA), an enterprise digital assistant (EDA), a digital still camera, a digital video camera, a portable multimedia player (PMP), a personal navigation device or portable navigation device (PND), a handheld game console, a mobile internet device (MID), a wearable computer, a drone), an Internet of Things (IoT) device, an Internet of Everything (IoE) device, etc.

The first device 110 may be implemented using an integrated circuit (IC), a System on Chip (SoC), an application processor (AP), a mobile AP, a chipset, or a set of chips. For example, the first device 110 may be a semiconductor device substantially performing a memory control function. But the first device 110 may also be one or more component(s) included in an AP (e.g., a memory controller, a random access memory (RAM), a central processing unit (CPU), a graphics processing unit (GPU), a modem, etc.).

The second device 120 may be implemented using at least one of a volatile memory device and a nonvolatile memory device. Here, the volatile memory device of the second device 120 may be, for example, a dynamic RAM (DRAM) and/or a static RAM (SRAM). In this regard, the second device 120 may be implemented using a double data rate synchronous dynamic random access memory (DDR SDRAM), a low power double data rate (LPDDR) SDRAM, a graphics double data rate (GDDR) SDRAM, a Rambus dynamic random access memory (RDRAM), etc. Alternately, the second device 120 may be implemented using a high bandwidth memory (HBM).

The nonvolatile memory device of the second device 120 may be at least one of a resistive memory such as a phase change RAM (PRAM), a magnetic RAM (MRAM), a resistive RAM (RRAM), etc. Hereinafter, for convenience of description, the first device 110 will be referred to as a memory controller, and the second device 120 will be referred to as a memory device. However, although the memory device 120 is illustrated as a single semiconductor chip, it may include any reasonable number of constituent memory devices.

The memory device 120 may be connected (or electromagnetically coupled) to the memory controller 110 by a bus 130. Those skilled in the art will appreciate that the bus 130 may be variously configured to include one or more bus(es) and/or signal line(s) configured to communicate command(s), address(es), data, clock signal(s), etc. For example, a command and/or address CA may be received by the memory device 120 from the memory controller 110 via a command/address bus portion (e.g., a "command/address bus") of the bus 130, data DQ may be communicated between the memory controller 110 and the memory device 120 via a data bus portion (e.g., a "data bus") of the bus 130, and one or more clock signals may be exchanged between the memory controller 110 and the memory device 120 via a clock bus portion (e.g., a "clock bus") of the bus 130. In some embodiments, the bus 130 may be dynamically reconfigurable.

In some embodiments, the bus 130 may include one or more signal line(s) configured to communicate system clocks CK_t and CK_c and data clocks WCK_t and WCK_c from the memory controller 110 to the memory device 120, as well as read clocks RDQS_t and RDQS_c from the memory device 120 to the memory controller 110. The system clocks CK_t and CK_c provided by the memory controller 110 to the memory device 120 may be used to control the timing of command/addresses communications, whereas the data clocks WCK_t and WCK_c and the read clocks RDQS_t and RDQS_c may be used to control the timing of data communication. He re, the system clocks CK_t and CK_c, the data clocks WCK_t and WCK_c, and the read clocks RDQS_t and RDQS_c are, respectively, complementary clock signals. In this regard complementary clock signals are characterized by a rising edge of one clock signal that coincides with a falling edge of another clock signal, and a rising edge of the another clock signal that coincides with a falling edge of the one clock signal.

The data clocks WCK_t and WCK_c may be synchronous with the system clocks CK_t and CK_c. In some embodiments, the data clocks WCK_t and WCK_c may have a higher frequency than the system clocks CK_t and CK_c. For example, the data clocks WCK_t and WCK_c may have a clock frequency that is four times (4×) the clock frequency of the system clocks CK_t and CK_c. Hereinafter, for convenience of description, the system clocks CK_t and CK_c may be referred to as "CK clock," the data clocks WCK_t and WCK_c may be referred to as "WCK clock," and the read clocks RDQS_t and RDQS_c may be referred to as "RDQS clock."

Consistent with the foregoing, the memory controller 110 may provide command(s) to the memory device 120 in order to control the execution (or performance) of memory access operations. Examples of various memory commands include; a timing command that controls the timing of various memory access operations, various data access commands corresponding to various memory access operations (e.g., a read command controlling a read operation and a write command controlling a write operation), a mode register write command controlling a mode register write operation, a mode register read command controlling a mode register read operation, etc.

In one illustrative example, a read command and a related read address may be provided from the memory controller 110 to the memory device 120. Upon receiving the read command and read address, the memory device 120 may execute a read operation that provides (or outputs) read data DQ retrieved from a location in memory corresponding to the read address. The read data DQ may then be provided from the memory device 120 to the memory controller 110 according to a timing scheme associated with the read command/read operation. For example, the timing may be related to a defined read latency (RL) value indicating a number of clock cycles ('tCK') for the CK clock following receipt of the read command by the memory device 120 that the read data DQ should be provided to the memory controller 110 via the data bus portion of the clock bus 130. Here, the RL value may be programmed in the memory device 120 by the memory controller 110. For example, the RL value may be programmed into one or more mode register(s) associated with the memory device 120. In this regard, those skilled in the art will appreciate that various mode register(s) may be included in the memory device 120 in order to store various information (or "settings") associated with operating modes, selecting features, etc. for various memory access operations. Here, one mode register setting may be the RL value.

Accordingly, during an initialization (or housekeeping) operation, that may occur well before the memory device 120 provides read data DQ to the memory controller 110, the memory controller 110 may provide an active WCK clock to the memory device 120, wherein the WCK clock may be used by the memory device 120 to generate the RDQS clock. (In this regard, a clock signal is "active" when it periodically transitions between a low clock level (hereafter, "low") and a high clock level (hereafter, "high"). In contrast, a clock signal is inactive when it maintains a constant clock level and does not periodically transition). The RDQS clock may then be communicated to the memory controller 110 and used thereafter by the memory controller 110 to control the timing of read operations. That is, the memory controller 110 may use an established RDQS clock to control reception of read data DQ.

In another illustrative example, a write command and a related write address may be provided to the memory device 120 by the memory controller 110. Upon receiving the write command and write address, the memory device 120 may perform a write operation that writes the write data DQ to a memory location corresponding to the write address. Here, the write data DQ may be provided to the memory device 120 according to timing related to reception of the write command. For example, write operation timing may be related to a write latency (WL) value indicating a number of clock cycles (tCK) for the clock CK following receipt of the write command at which the write data DQ is provided to the memory controller 110. As before, the WL value may be programmed in a mode register of the memory device 120

Accordingly, during an initialization (or housekeeping) operation that may occur well before the memory controller 110 receives the write data DQ, the memory controller 110 may provide an active WCK clock to the memory device 120. The WCK clock may be used by the memory device 120 to generate an internal clock signal controlling timing of circuit(s) used during the writing of the write data DQ. Thus, the memory device 120 may receive the write data DQ according to the WCK clock, and the write data DQ may be written to a memory corresponding to the write address.

In order to accurately perform memory operations according to defined timings, the memory controller 110 may include a training circuit 112 configured to perform memory training on the memory device 120. Thus, the training circuit 112 may perform, in response to a training command, memory core parameter training associated with a memory core and/or peripheral circuit parameter training on peripheral circuits other than the memory core in the memory device 120. The training circuit 112 may be hardware, software or a combination of same that performs training and determines optimal parameters for memory core parameters and/or peripheral circuit parameters. In some embodiments, the training circuit 112 may be included in the memory controller 110. Alternately, however, the training circuit 112 may be included in the memory device 120, and the memory device 120 may perform memory training.

In some embodiments, the training circuit 112 may perform a first clock training operation in relation to the WCK clock, and a second clock training operation in relation to the RDQS clock as part of (e.g.,) a particular peripheral circuit parameter training. Of particular note with respect to some embodiments of the inventive concept, the training circuit 112 may be configured to simultaneously perform (e.g., overlapping during at least a material period of time) the second clock training operation on the RDQS clock together with the first clock training operation on the WCK clock. This feature will be described hereafter in some additional detail in relation to FIG. 9.

In some embodiments, the memory device 120 may include a mode register 122 (hereinafter, "MRS"), a data clock circuit 124, and a data input/output (I/O) circuit 126.

The MRS 122 may store information that is used to variously configure the memory device 120 in relation to data access operation(s) and/or operating condition(s) associated with the memory device 120. Thus, the MRS 122 may be used to store information associated with the definition, control and/or monitoring of the WCK clock and the RDQS clock.

The data clock circuit 124 may perform a duty cycle monitoring function (hereafter, "duty cycle monitoring") that monitors duty of the WCK clock and/or provides a timing-adjusted WCK clock. Alternately or additionally, the data clock circuit 124 may perform duty cycle monitoring that monitors duty of the RDQS clock and/or provides a timing-adjusted RDQS clock. In some embodiments, the data clock circuit 124 may generate a read clock offset code by calculating an offset for the RDQS clock in relation to the timing-adjusted WCK clock based on a duty cycle monitoring result for at least one of the WCK clock and the RDQS clock. Thereafter, the data clock circuit 124 may correct a duty error of the RDQS clock using the read clock offset code.

The data clock circuit 124 may provide a duty cycle monitoring result for the WCK clock to the memory controller 110. In some embodiments, the duty cycle monitoring result may be stored, wholly or in part, in a mode register associated with the memory device 120. Then, for example, the duty cycle monitoring result for the WCK clock may be returned (or provided) to the memory controller 110 in response to a mode register read command issued by the memory controller 110. In similar manner, the data clock circuit 124 may provide the read clock offset code calculated in relation to the timing-adjusted WCK clock to the memory controller 110.

The data I/O circuit 126 may communicate read data DQ to the memory controller 110 synchronously with the timing-adjusted RDQS clock, and receive write data DQ from the memory controller 110 synchronously with the timing-adjusted WCK clock. In various embodiments, the (read or write) data DQ communicated by the data I/O circuit 126 may be formatted to have data width of (e.g.,) eight (8) bits, or sixteen (16) bits wherein the 16 bits may be divided (e.g.,) into a lower 8-bit byte and a higher 8-bit byte.

As illustrated in FIG. 1, the apparatus 100—consistent with an embodiment of the inventive concept—may include a host (e.g. the memory controller 110) electrically connected to the memory device 120 via the bus 130. In this regard, the bus 130 may be connected to the memory device 120 through an arrangement of signal pins 140. In some embodiments, the signal pins may include at least one of; a first signal pin configured to communicate the data clock WCK, a second signal pin configured to communicate the read clock RDQS, a third signal pin configured to communicate read data and/or write data DQ (hereafter, "read/write data DQ)", a fourth signal pin configured to communicate the command/address CA, and a fifth signal pin configured to communicate the system clock signal CK. Here, the data clock WCK may control data write timing of a write operation executed by the memory device 120 and/or data read timing for a read operation executed by the memory device 120, and the read clock RDQS may control communication of read data from the memory device 120 to the memory controller 110.

The memory device 120 may include the data clock circuit 124 configured to receive the data clock WCK from the first signal pin and the read clock RDQS from the second signal pin, and further configured to: (1) perform the first duty cycle monitoring (DCM1) that monitors a duty cycle of the data clock WCK and provides a timing-adjusted data clock WCK in response to the first duty cycle monitoring (DCM1); (2) perform the second duty cycle monitoring (DCM2) that monitors the duty cycle of the read clock RDQS and provides a timing-adjusted read clock RDQS; (3) calculates an offset for the read clock RDQS (hereafter, the "read clock offset code") in response to the timing-adjusted data clock WCK in accordance with a first result of the first duty cycle monitoring (DCM1) and a second result of the second duty cycle monitoring (DCM2); and (4) corrects a duty error of the read clock using the read clock offset code.

Figure 2:
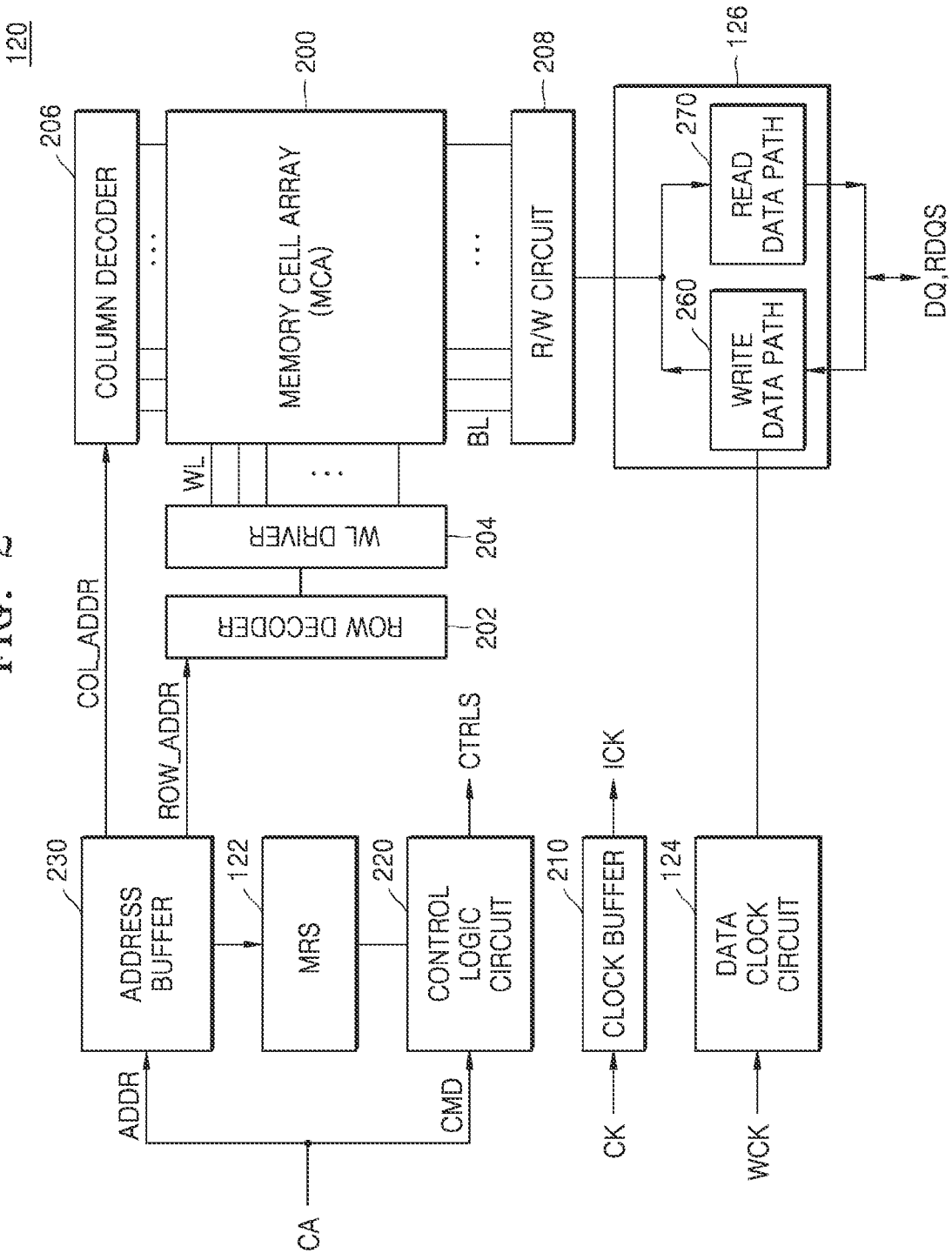
FIG. 2 is a block diagram further illustrating in one example the second device 120 of FIG. 1.

FIG. 2 is a block diagram further illustrating in one example the memory device 120 of FIG. 1.

Referring to FIGS. 1 and 2, the memory device 120 may include a memory cell array 200, a row decoder 202, a word line driver 204, a column decoder 206, and a read/write circuit 208, a clock buffer 210, a control logic circuit 220, an address buffer 230, the MRS 122, the data clock circuit 124, and the data I/O circuit 126.

The memory cell array 200 may include memory cells (e.g.,) arranged in a matrix of rows and columns. The memory cell array 200 may further include word lines WL and bit lines BL connected to the memory cells. Here, the word lines WL may be connected to rows of the memory cells, and the bit lines BL may be connected to columns of the memory cells.

The row decoder 202 may select (e.g., using a row select signal) one or more of the word lines WL (e.g.,) in response to a row address ROW_ADDR received via the command/address CA portion of the bus 130 and the address buffer

230. That is, a selected word line WL may be connected to the word line driver 204 in order to be activated in relation to one or more applied word line voltage(s). Similarly, the column decoder 206 may select (e.g., using a column select signal) one or more bit lines BL (e.g.,) in response to a column address COL_ADDR received via the command/address CA portion of the bus 130 and the address buffer 230. That is, a selected bit line BL may be connected to the read/write circuit 208 in order to be activated in relation to one or more applied bit line voltage(s).

The read/write circuit 208 may include read data latches configured to store the read data received via the bit lines BL selected by the column selection signal, and a write driver configured to write the write data to memory cells of the memory cell array 200. The read data stored in the read data latches of the read/write circuit 208 may be provided to a data DQ bus portion of the bus 130 through a data output driver associated with a read data path 270. The write data may be applied to the memory cell array 200 through a data input buffer associated with a write data path 260 connected to the data DQ bus portion of the bus 130 and through a write driver of the read/write circuit 208.

The clock buffer 210 may receive a CK clock and generate one or more internal clock signal(s) ICK. Here, the internal clock signal(s) ICK may be provided to the control logic circuit 220 and used in relation to various operation controlling the timings of various internal circuits of the memory device 120. In this regard, the control logic circuit 220 may receive one or more command(s) CMD via the command/address CA bus and generate various control signals CTRLS that control the operational timing and/or memory access operation(s) of the memory device 120. The control logic circuit 220 may read data from the memory cell array 200 and/or write data to the memory cell array 200 in response to the various control signals CTRLS.

The MRS 122 may store information used by the control logic circuit 220 to variously configure the memory device 120 in relation to memory access operations and/or operating conditions for the memory device 120. In this regard, the MRS 122 may include a register that stores parameter code(s) associated with various memory access operations, as well as control parameters used to set operating conditions for the memory device 120. Here, a parameter code may be provided to the memory device 120 via the command/address bus portion of the bus 130. And the control logic circuit 220 may provide the control signals CTRLS to various internal circuits of the memory device 120 to properly operate in relation to one or more data access operations, control parameters and other information stored in the MRS 122.

The data I/O circuit 126 may include a portion of the write data path 260 including a data input buffer and a portion of the read data path 270 including a data output driver. The write data path 260 may include a flip-flop circuit that receives the write data DQ. The read data path 270 may include a flip-flop circuit that communicates read data DQ. Furthermore, the read data path 270 may include circuits that perform various functions related to the read operation, such as output drive strength, preamble/post amble length, pull-down/on-die-termination (ODT) and pull-up/output high level voltage (Voh) calibration, pre-emphasis, etc. Pull-down/ODT and pull-up/Voh calibration may be provided to improve signal integrity (SI) by adjusting a voltage swing width and/or drive strength for signals received via the command/address CA portion and/or the data DQ bus portions of the bus 130. The pre-emphasis function may be provided to improve SI by increasing a data eye opening area of a signal transmitted via the data DQ bus. The read data path 270 may have a relatively longer propagation delay factor than the write data path 260.

The data clock circuit 124 may adjust a duty cycle of the WCK clock and/or a duty cycle of the RDQS clock by a monitoring duty cycle associated with same. In this regard, the data clock circuit 124 may provide the duty cycle monitoring result for the WCK clock in relation to input conditions corresponding to respective steps of a duty cycle adjustment (DCA) code indicating a DCA range that includes non-flip and flip setting(s). And similarly, the data clock circuit 124 may provide a duty cycle monitoring result for the RDQS clock with respect to input conditions corresponding to respective steps of a DCA code indicating a DCA range that includes non-flip and flip setting(s).

The data clock circuit 124 may generate a read clock offset code in response to the duty cycle monitoring result according to a non-flip setting of the WCK clock and the RDQS clock. Alternately or additionally, the data clock circuit 124 may generate a read clock offset code in response to a duty cycle monitoring result according to a flip setting of the WCK clock and the RDQS clock.

Figure 3:
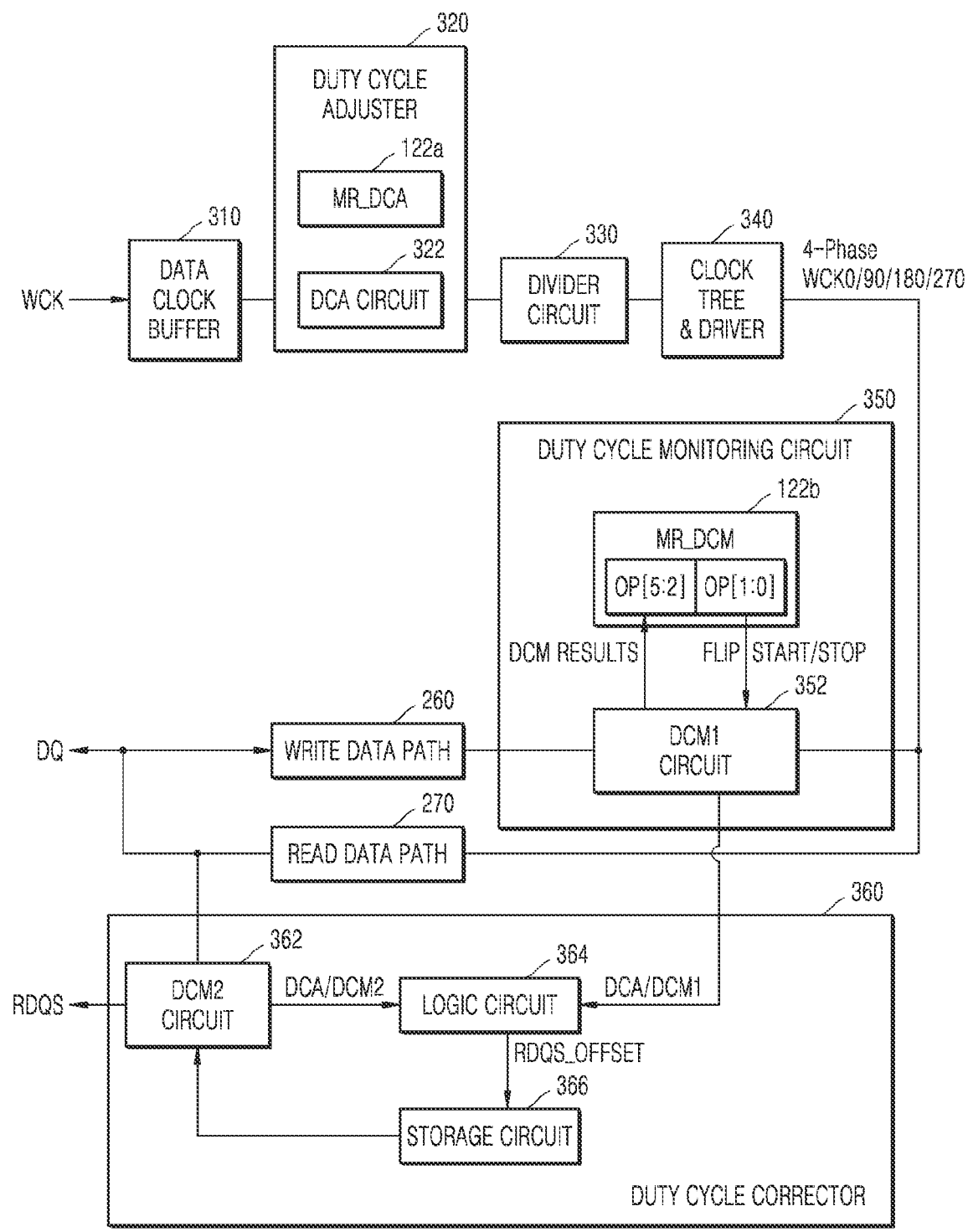
FIG. 3 is a block diagram further illustrating in one example the data clock circuit 124 of FIG. 1.

FIG. 3 is a block diagram further illustrating in one example the data clock circuit 124 of FIG. 1. Referring to FIGS. 1, 2 and 3, the data clock circuit 124 may be included (or disposed) in a portion of a WCK path and/or a RDQS path of the memory device 120. Hereinafter, certain subscripts attached to previously introduced reference numerals (e.g., 'a' in 122a and 'b' in 122b) may be understood as indicating a particular one of a plurality of circuits performing a same function.

In some embodiments, the data clock circuit 124 may include a data clock buffer 310, a duty cycle adjuster 320, a divider circuit 330, a clock tree and driver circuit 340, a duty cycle monitoring 350, and a duty cycle corrector 360.

The data clock buffer 310 may be used to buffer the WCK clock and provide a resulting buffered WCK clock to the duty cycle adjuster 320. The duty cycle adjuster 320 (hereinafter referred to as a "DCA") may include a DCA circuit 322 configured to adjust timing of the buffered WCK clock and thereby generate a timing-adjusted WCK clock. In this regard, the DCA circuit 322 may adjust the buffered WCK clock in response to information programmed in a first mode register (MR_DCA) 122a.

For example, the information programmed in the first mode register 122a may be a DCA code corresponding to respective stages of a DCA adjustment range. For example, the timing of the buffered WCK clock is adjusted by programming a DCA code in the first mode register 122a that corresponds with a desired timing outcome. In some embodiments, a DCA code may be programmed in the first mode register 122a using the memory controller 110. Therefore, the timing of the buffered WCK clock may be adjusted by changing (or defining) the DCA code programmed in the first mode register 122a. In this manner, for example, the DCA circuit 322 may provide the timing-adjusted WCK clock to the divider circuit 330.

The divider circuit 330 may provide a number (e.g., four) of internal WCK clock signals, wherein each internal WCK clock signal has frequency lower than that the frequency of the WCK clock (e.g., one-half that of the frequency of the WCK clock). In some embodiments, the internal WCK clocks may have a phase relationship with respect to one another. For example, the divider circuit 330 may define phase relationships that vary by 90 degrees with respect to one another (e.g., 0 degrees, 90 degrees, 180 degrees and 270 degrees) and each of the four internal WCK clocks (WCKO/90/180/270). However, those skilled in the art will recognize that the number, frequency and/or phase relationship(s) of the internal WCK clocks may vary by design.

The internal WCK clocks provided by the divider circuit 330 may be variously provided to one or more internal circuit(s) of the memory device 120 using (e.g.,) the clock tree & driver circuit 340. For example, an internal WCK clock may be provided to the write data path 260 and/or the read data path 270 of the data I/O circuit 126 by the clock tree and driver circuit 340 to control the timing of operation of a data receiver receiving write data.

In this regard, one or both of the data clock buffer 310 and the clock tree & driver circuit 340 may have unique circuit features that potentially allow undesired changes in timing with respect to the internal WCK clocks to arise. Such unique circuit features may result in deviations from ideal circuit features due to changes in operation caused by variations in manufacturing process(es) and/or changes in temperature and voltage. As a result, it is possible that as the data clock buffer 310 and the clock tree and driver circuit 340 provide an internal WCK clock, a duty cycle of the internal WCK clock may be inadvertently changed, thereby resulting in the internal WCK clock having a distorted (e.g., materially deviating from an ideal) duty cycle, as compared with the externally-provided data clock (WCK). As a result, timing of the distorted, internal WCK clock may result in performance deviation(s) in one or more internal circuit(s) operating in response to the internal WCK clock.

In this regard, the duty cycle monitoring 350 (hereinafter referred to as a "DCM monitor") may monitor timing of internal WCK clock(s) provided by the clock tree and driver circuit 340. For example, the DCM monitor 350 may monitor a duty cycle of one or more of the internal WCK clock(s). The DCM monitor 350 may include a first DCM circuit 352 associated with a second mode register 122b and may connected to (or disposed in) a portion of the write data path 260.

The first DCM circuit 352 may monitor one or more internal WCK clock(s) provided by the clock tree and driver circuit 340, and provide timing information indicating specific timing characteristics of the internal WCK clock(s). Such timing information may include, for example, a first duty cycle monitoring (DCM) result associated with monitoring performed by the first DCM circuit 352. Thus, should one or more circuit(s) in a data clock path cause an undesirable timing change related to an internal WCK clock, the first DCM circuit 352 may be used to determine the nature and/or extent of the undesirable change. Accordingly, a DCM result may be provided to the second mode register 122b, wherein the DCM result may be accessed and/or externally-provided (e.g.,) in response to a mode register read command. In some embodiments, the first DCM circuit 352 may include a circuit monitoring an internal WCK clock including to upper and lower bytes associated with (read/write) data including upper and lower bytes.

The second mode register 122b may be programmed with control information controlling operation of the first DCM circuit 352. For example, such control information may be used to control a monitoring period during which the first DCM circuit 352 monitors the internal WCK clock (e.g., start and stop times controlling the monitoring operation performed by the first DCM circuit 352). As another example, the control information may be used to configure the first DCM circuit 352 to change (or "flip") an input condition when monitoring the internal WCK clock. Accordingly, the monitoring of the internal WCK clock may be performed under a first input condition, and then by flipping the first input condition to a second input condition, the internal WCK clock may be further or differently monitored.

Hence, a corresponding DCM result generated by the first DCM circuit 352 with respect to various input condition(s) may be provided to the second mode register 122b as information. The information may be programmed in the second mode register 122b as opcodes, which may correspond to certain bits of the second mode register 122b. Referring to FIG. 3, information controlling start/stop times for the first DCM circuit 352, and/or flipping an input condition for variable monitoring of an internal WCK clock may be programmed in the second mode register 122b using (e.g.,) 2-bit opcodes (e.g., OP[1:0]). Further, for example, a first DCM result provided by the first DCM circuit 352 may be programmed using 4-bit opcodes (e.g., OP[5:2]). However, those skilled in the art will appreciate that a number of register bits allocated for information (and resulting opcodes programmed into the second mode register 122b) may vary by design.

For data including defined lower and upper bytes, a separate clock path may be provided for an internal clock signal associated with each of the lower and upper bytes. Each clock path may include a circuit configured to individually monitor an internal clock signal associated with to each of the upper and lower bytes. For example, the data clock circuit 124 may be included in a clock path providing a first internal clock signal associated with a first byte of data, and adjust timing of the first internal clock signal based on monitoring of the first internal clock signal. Likewise, the data clock circuit 124 may be included in a clock path providing a second internal clock associated with a second byte of data, and adjust timing of the second internal clock signal based on monitoring of the second internal clock signal.

Thus, the DCM monitor 350 may provide results to the second mode register 122b related to the monitoring of timing of an internal WCK clock provided by the clock tree & driver circuit 340. For example, a first DCM result DCA/DCM1 resulting from the monitoring of the internal WCK clock (the timing of which may have been adjusted in response to the DCA code) may be provided to the duty cycle corrector 360 (hereinafter referred to as a "DCC corrector"). Thus, in some embodiments, the first DCM result DCA/DCM1 may include a DCM result for one or more DCA code(s) which may be used to correct the duty cycle of the RDQS clock by operation of the DCC corrector 360.

In this regard, the DCC corrector 360 may monitor timing of a RDQS clock generated in response to the internal WCK clock provided by the clock tree & driver circuit 340, wherein the DCC corrector 360 may be connected to a portion of the read data path 270 in order to monitor a duty cycle of the RDQS clock. In some embodiments, the DCC corrector 360 may include a second DCM circuit 362 connected to the read data path 270, as well as a logic circuit 364, and a storage circuit 366.

The second DCM circuit 362 may monitor the RDQS clock provided by the read data path 270 and provide information indicating timing of the RDQS clock. The information may include results of a second duty cycle monitoring (e.g., a result corresponding to a start of monitoring by the second DCM circuit 362, a result corresponding to a stop of monitoring by the second DCM circuit 362, and/or a result according to flip/un-flip input conditions associated with monitoring of respective upper and lower bytes). A second DCM result provided by the second DCM circuit 362 with respect to condition(s) may be provided to the logic circuit 364 as the information. The second DCM circuit 362 may provide the logic circuit 364 with a second DCM result DCA/DCM2 obtained by monitoring the RDQS clock—the timing of which may be adjusted in response to a DCA code.

In some embodiments, the logic circuit 364 may receive the first DCM result DCA/DCM1 and the second DCM result DCA/DCM2, and perform a subtraction operation in relation to a first bit value of the first DCM result DCA/DCM1 and a second bit value of the second DCM result DCA/DCM2. Hence, the logic circuit 364 may include a subtractor. A resulting difference value between the first DCM result DCA/DCM1 and the second DCM result DCA/DCM2 may be provided by the logic circuit 364. Under certain circumstances, the difference value between the first DCM result DCA/DCM1 and the second DCM result DCA/DCM2 may be reasonably predicted to have been caused by the read data path 270 having a relatively longer propagation delay than the write data path 260. Accordingly, the difference value between the first DCM result DCA/DCM1 and the second DCM result DCA/DCM2 may approximate (or represent) an offset for the RDQS clock with respect to the WCK clock, and may be referred to as an RDQS offset code (RDQS_OFFSET).

In this regard, the storage circuit 366 may store the RDQS offset code RDQS_OFFSET calculated by the logic circuit 364. The storage circuit 366 may be implemented using a register or a fuse circuit that stores the RDQS offset code RDQS_OFFSET. The fuse circuit may be configured as an anti-fuse including a plurality of anti-fuses. An anti-fuse has electrical characteristics opposite to those of a fuse element, and is a resistive fuse element having a high resistance value in an unprogrammed state, but a low resistance value in a programmed state. The storage circuit 366 may store the RDQS offset code RDQS_OFFSET by selectively programming anti-fuses.

The DCC corrector 360 may calculate an RDQS offset code RDQS_OFFSET based on the first DCM result DCA/DCM1 provided by the DCM monitor 350 and the second DCM result DCA/DCM2 obtained by monitoring the RDQS clock—the timing of which may be adjusted based on the DCA code. By using the RDQS offset code RDQS_OFFSET, the DCC corrector 360 may correct an RDQS clock duty error in order to restore the RDQS clock to a 50% duty cycle.

Figure 4:
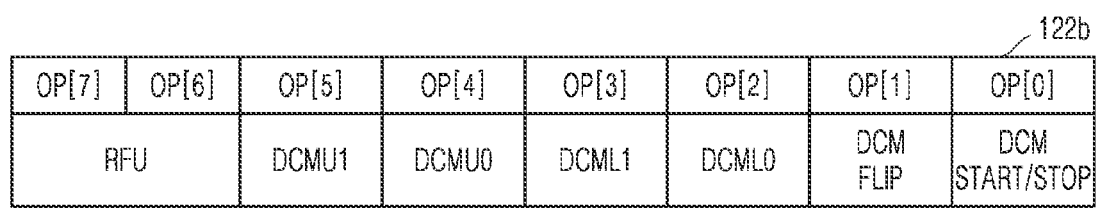

FIGS. 4 and 5 are respective tables listing examples of DCM features according to embodiments of the inventive concept. Thus, FIGS. 4 and 5 may relate to the second mode register 122b described in relation to FIG. 3, wherein FIG. 4 illustrates a mode register associated with a first DCM operation performed by the first DCM circuit 352 of FIG. 3, and FIG. 5 illustrates exemplary opcodes with respect to the mode register associated with the first DCM operation. It follows that in relation to these illustrated examples, the first DCM operation is a WCK DCM in which the memory controller 110 is assumed to monitor WCK duty cycle distortion in an internal WCK clock provided by the clock tree & driver 340 in the memory device 120.

Referring to FIGS. 3, 4 and 5, the first DCM operation may be started by writing OP[0] of the second mode register 122b as 1b. Setting OP[0] of the second mode register 122b=0b may stop the first DCM operation. Before starting the first DCM operation, an operation synchronizing the WCK clock with the CK clock may be performed.

Until the first DCM operation is stopped by writing OP[0]=0b, it is necessary to continue toggling the applied WCK clock while the first DCM operation is activated. When the first DCM operation is activated, the first DCM operation may be simultaneously performed on both lower and upper bytes. Two separate DCM results may be provided for each byte. A DCM result on the lower byte may be provided as DCML0 and DCML1, and a DCM result on the upper byte may be provided as DCMU0 and DCMU1.

Assuming that the DCM circuit operates with hysteresis, the first DCM result may be inaccurate. To increase the accuracy of the first DCM operation, a second DCM operation may support repeat-monitoring after flipping the input by setting OP[1] of the second mode register 122b to an opposite state. The first DCM result may be determined according to the state of a DCM flip bit OP[1]. For example, when DCM flip=0 (un-flip), then DCML0 and DCMU0 will be provided, and when DCM flip=1 (flip), then DCML1 and DCMU1 may be provided. A first DCM flip and a first DCM stop may be used by the memory controller 110 to capture the first DCM result.

For example, when a WCK high duty cycle for each byte according to the DCM input condition is less than 50%, the first DCM result may be set to a bit value of "0", but when 50% or more, the first DCM result may be set to a bit value of "1."

The first DCM operation described in relation to FIGS. 4 and 5 may be similarly applied to the second DCM operation monitoring a RDQS duty cycle distortion and performed by the second DCM circuit 362 of FIG. 3. The second DCM operation is an RDQS DCM in which distortion of an RDQS duty cycle in a read data path of the memory device 120 may be monitored. The RDQS clock needs to toggle continuously while the second DCM operation is activated. When the second DCM operation is activated, the second DCM operation may be simultaneously performed on both the lower and upper bytes, and when DCM flip=0 according to a state of a DCM flip bit, DCML0 and DCMU0 will be provided, and when DCM flip=1, DCML1 and DCMU1 will be provided.

Figure 6:
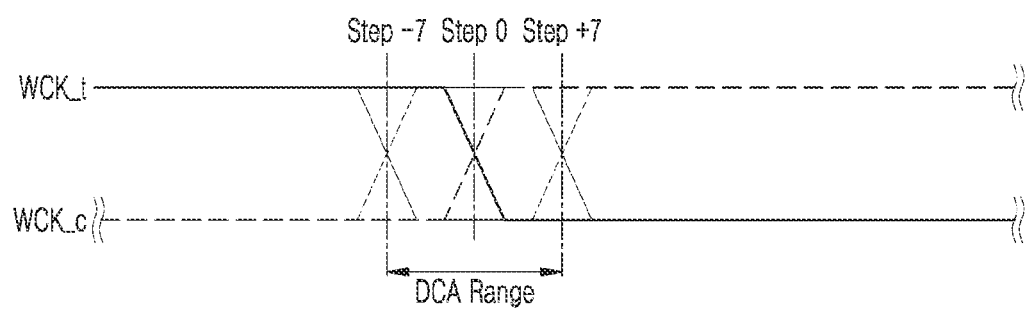
Figure 8:
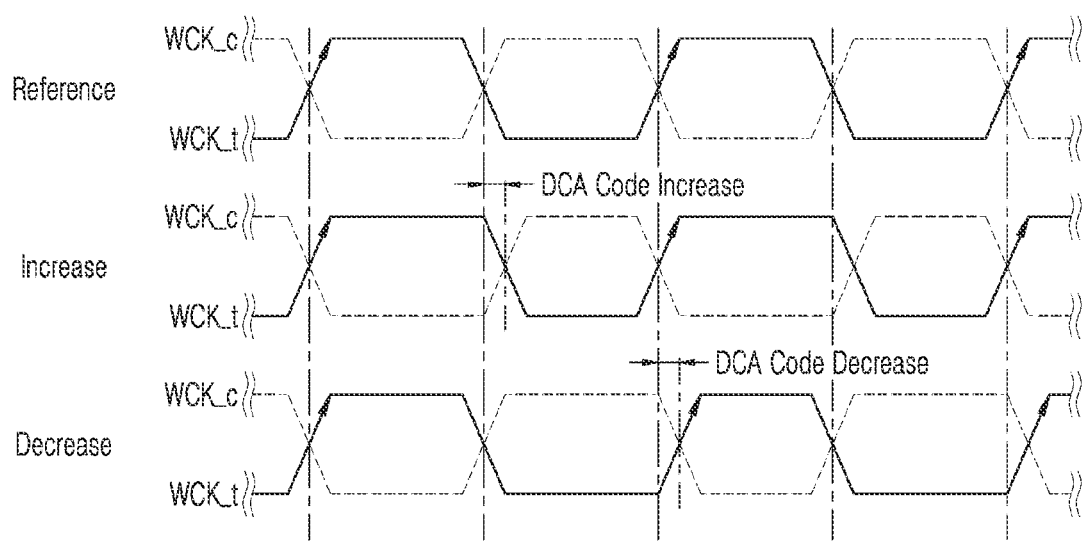

FIGS. 6, 7 and 8 are diagrams further illustrating exemplary DCA features according to embodiments of the inventive concept (e.g., in relation to the DCA adjuster 320 of FIG. 3). Here, FIG. 6 is a timing diagram for the DCA adjuster 320, FIG. 7 is a table listing DCA codes, and FIG. 8 is a timing diagram for a data clock signal adjusted using the DCA adjuster 320.

An exemplary DCA operation (e.g., a WCK DCA operation) is assumed in which a mode register may be adjusted. That is, the memory controller 110 may compensate for a WCK duty cycle error by adjusting an internal WCK clock tree duty cycle in conjunction with the first DCM circuit 352. Also, another DCA operation (e.g., a RDQS DCA operation) is assumed in which an RDQS offset is determined so that the memory controller 120 may compensate for an RDQS duty cycle in conjunction with the second DCM circuit 362. In this regard, a WCK DCA for adjusting a duty cycle of an internal WCK clock is described.

The WCK DCA may be located prior to the divider circuit 330 or may be in a functionally equivalent location. The memory controller 110 may adjust the duty cycle of the internal WCK clock by programming a DCA code in the first mode register 122a. Assuming that the first mode register 122a includes 8-bit opcodes, the memory controller 110 may adjust the duty cycle of the internal WCK clock through opcode OP[3:0] for DCAL and OP[7:4] for DCAU settings. The opcode OP[3:0] with respect to DCAL may be related to DCM for a lower byte, and OP[7:4] with respect to DCAU setup may be related to DCM for an upper byte. In some embodiments, a preferred mode register setting of DCA may be determined by the memory controller 110 in various manners.

Referring to FIG. 6, an example of adjusting an internal WCK over the DCA range is illustrated. In FIG. 7, the DCA code may include, for example, an adjustment range of +7 to −7 steps. In this manner, DCA may include 15 steps of the DCA range to adjust a duty cycle of the internal WCK clock. For example, the opcode OP[3:0] for DCAL of the first mode register 122a may be represented by the DCA code as illustrated in FIG. 7. Adjusting the DCA by increasing (+) the DCA code (or steps) may increase a high duty cycle of the WCK clock, whereas adjusting the DCA by decreasing (−) the DCA code (or steps) may decrease the high duty cycle of the WCK clock. FIG. 8 illustrates an increase in a high duty cycle of the WCK clock with respect to an increase in DCA code and a decrease in the high duty cycle of the WCK clock with respect to a decrease in DCA code.

Figure 9:
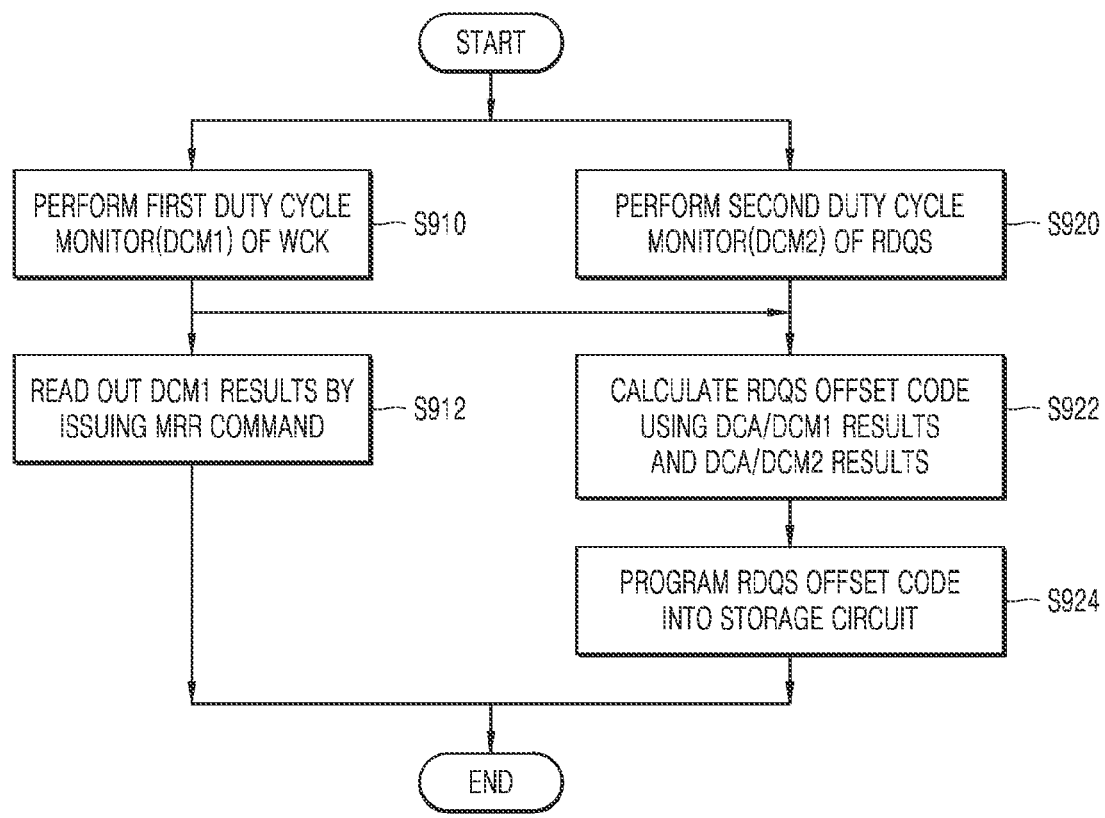
Figure 10:
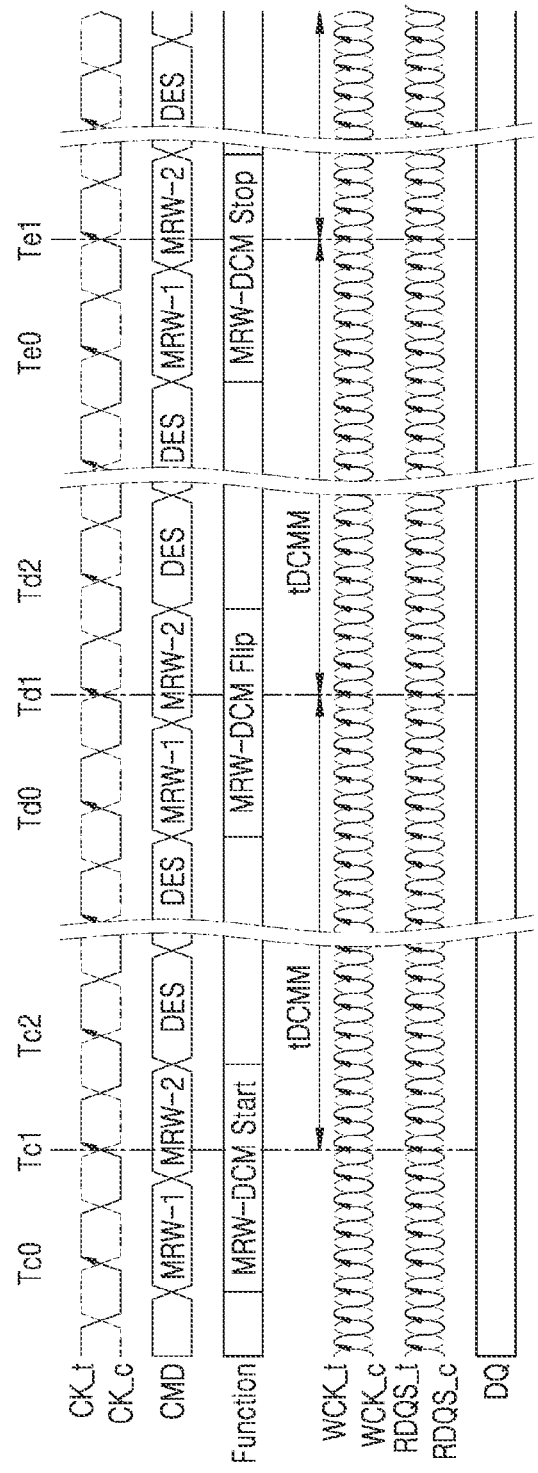

FIGS. 9, 10 and 11 are respective diagrams illustrating in one example a method of clock training according to embodiments of the inventive concept, wherein FIG. 9 is a flowchart summarizing a clock training method that may be performed during an initialization operation for the memory device 120, FIG. 10 is a timing diagram further illustrating the clock training method of FIG. 9, and FIG. 11 includes a set of tables listing exemplary DCM results associated with the clock training method of FIG. 9. For convenience of description, a first DCM operation and a second DCM operation will be described in relation to DCML and DCAL with respect to a lower byte. In some embodiments, the clock training method of FIG. 9 may be performed by a host (e.g., a testing host) performing functional and/or performance testing of the memory device 120. That is, a testing host (e.g., an automatic or semiautomatic testing apparatus) may function in a role of a memory controller performing clock training as part of a larger battery of memory device testing.

Referring to FIG. 9 in the context of the foregoing embodiments (e.g., FIGS. 1 to 8 inclusive), the memory device 120 may perform the first DCM operation on a WCK clock (S910). The first DCM operation may be performed by the first DCM circuit 352 in conjunction with the MRS 122. Also, the memory device 120 may perform the second DCM operation on an RDQS clock (S920). The second DCM operation may be performed by the second DCM circuit 362 in conjunction with the MRS 122. The first DCM operation on the WCK clock and the second DCM operation on the RDQS clock may be performed simultaneously (e.g., at least partially in parallel). Examples of the first and second DCM operations S910 and S920 will be described hereafter in relation to FIG. 10.

Referring to FIG. 10, DCM may be started as the memory controller 110 issues a mode register write command (including commands MRW-1 and MRW-2) to the memory device 120. The mode register write command may be received between times Tc0 and Tc1. The memory controller 110 may wait for a time tDCMM for the first DCM circuit 352 to complete WCK duty cycle measurement. During tDCMM, the second DCM circuit 362 may complete RDQS duty cycle measurement. In this case, the first and second DCM circuits 352 and 362 may perform WCK and RDQS duty cycle measurements with non-flip inputs.

Between times Td0 and Td1, the memory controller 110 may issue a mode register write command to switch OP[1] code of the second mode register 122b to flip an input of the first DCM operation (S910). For example, transitioning a DCM flip bit from low to high may automatically: (1) capture a current DCM result; (2) store a DCM result in OP[2]/OP[4] of the second mode register 122b; and (3) reset and restart DCM. Transitioning a DCM flip bit from high to low may automatically: (1) capture a current DCM result; (2) store a DCM result in OP[3]/OP[5] of the second mode register 122b; and (3) reset and restart DCM.

The memory controller 110 may wait for the time tDCMM for the first DCM circuit 352 to complete WCK duty cycle measurement with flip inputs. During tDCMM, the second DCM circuit 362 may also complete RDQS duty cycle measurement with flip inputs.

Between time Te0 and Te1, the memory controller 110 may issue a mode register write command to exit the first DCM operation and the second DCM operation. When exiting the first DCM operation, a current DCM result may be automatically captured when OP[1] of the second mode register 122b is low, and stored in OP[2]/OP[4] of the second mode register 122b, and a current DCM result may be automatically captured when OP[1] of the second mode register 122b is high and stored in OP[3]/OP[5] of the second mode register 122b. The memory device 120 may provide a first DCM result DCA/DCM1 by monitoring a WCK clock, —the timing of which may be adjusted in response to the DCA code in the first DCM operation and provide a second DCM result DCA/DCM2 by monitoring an RDQS clock 0 the timing of which may be adjusted based in response to the DCA code in the second DCM operation.

In FIG. 9, the memory controller 110 may issue an MMR command using a normal MRR timing to read a DCM result stored in OP[5:2] of the second mode register 122b by the first DCM operation on the WCK clock. The memory device 120 may read information stored in the second mode register 122b by the first DCM operation by the MRR command issued by the memory controller 110 (S912).

As illustrated in FIG. 11, the first DCM result DCA/DCM1 provided in the first DCM operation may include a first DCM result 1110 according to a non-flip setting and a first DCM result 1111 according to a flip setting. In addition, the second DCM result DCA/DCM2 provided in the second DCM operation may also include a second DCM result 1120 according to a non-flip and a second DCM result 1121 according to a flip.

Referring to FIG. 11, the first non-flip DCM result 1110 and the first flip DCM result 1111 may be initially set to, for example, a bit value of default "0" with respect to the DCA code. After the first DCM operation (S910), the first non-flip DCM result 1110 is changed from the default "0" bit value to "1" bit value in DCA code −1, and has a "1" bit value from DCA code −1 to +7. That is, the first non-flip DCM result 1110 indicates that the WCK high duty cycle is 50% or more in DCA code −1. The first flip DCM result 1111 is changed from a default "0" bit value to a "1" bit value in DCA code+2, and has a "1" bit value from DCA codes+2 to +7. That is, the first flip DCM result 1111 indicates that the WCK high duty cycle is 50% or more in DCA code +2.

The second non-flip DCM result 1120 and the second flip DCM result 1121 may also be initially set to a default "0" bit value with respect to DCA code. After the second DCM operation (S920), the second non-flip DCM result 1120 is changed from default "0" bit value to "1" bit value at DCA code −4, and has a "1" bit value from DCA codes −4 to +7. That is, the second non-flip DCM result 1120 indicates that the RDQS high duty cycle is 50% or more in DCA code −1. The second flip DCM result 1121 is changed from a default "0" bit value to a "1" bit value at DCA code+5, and has a "1" bit value from DCA codes+6 to +7. That is, the second flip DCM result 1121 indicates that the RDQS high duty cycle at DCA code+5 is 50% or more.

In FIG. 9, the memory device 120 may calculate the RDQS offset code RDQS_OFFSET by using the first DCM result DCA/DCM1 and the second DCM result DCA/DCM2 (S922). The RDQS offset code RDQS_OFFSET may be provided by the logic circuit 364 as a difference value between the first DCM result DCA/DCM1 and the second DCM result DCA/DCM2. As illustrated in FIG. 11, the RDQS offset code RDQS_OFFSET may include an RDQS offset code RDQS_OFFSET 1130 with respect to a non-flip setting and an RDQS offset code RDQS_OFFSET 1131 according to a flip setting. The RDQS offset code RDQS_OFFSET 1130 with respect to the non-flip setting has a bit value of "1" from DCA codes −4 to −2, and the RDQS offset code RDQS_OFFSET 1131 according to the flip setting has a bit value of "1" from DCA codes+2 to +4.

The memory device 120 may program the RDQS offset code RDQS_OFFSET in the storage circuit 366 (S924). The memory device 120 may correct a duty error of the RDQS clock by evaluating the programmed RDQS offset code RDQS_OFFSET. The memory device 120 may correct the duty error of the RDQS clock based on any one of the RDQS offset code RDQS_OFFSET 1130 with respect to the non-flip setting and the RDQS offset code RDQS_OFFSET 1131 according to the flip setting.

For example, when correcting an RDQS clock duty error using the RDQS offset code RDQS_OFFSET 1130 with respect to the non-flip setting, the memory device 120 may select one of a minimum value, a middle value (or a value close to the middle value), and a maximum value between DCA codes −4 and −2 and adjust the RDQS clock to have a high duty cycle of 50%. In contrast, when correcting an RDQS clock duty error by using the RDQS offset code RDQS_OFFSET 1131 according to the flip setting, the memory device 120 may select one of a minimum value, a middle value (or a value close to the middle value), and a maximum value between DCA codes+2 and +4 and adjust the RDQS clock have a high duty cycle of 50%.

When the clock training method of FIG. 9 is performed in a performance test operation of the memory device 120, the RDQS offset code RDQS_OFFSET calculated in operation S922 may be provided to the test host. The test host may adjust an RDQS duty based on the received RDQS offset code RDQS_OFFSET without performing an RDQS clock training test.

Figure 12:
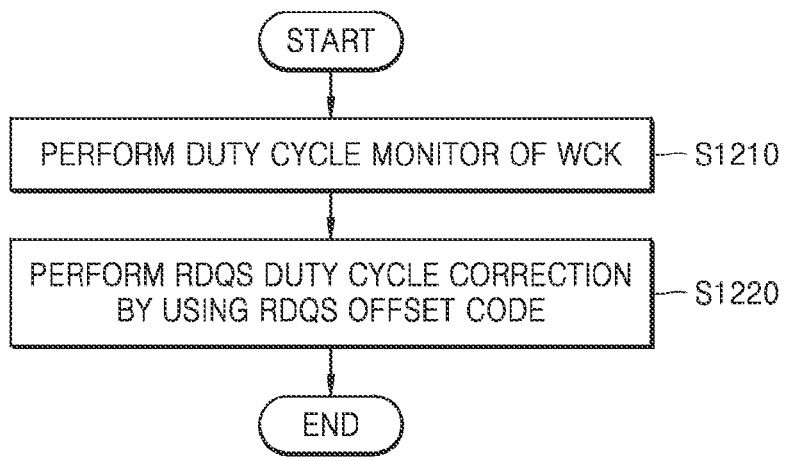
FIGS. 12 and 13 are respective diagrams illustrating a clock training method according to embodiments of the inventive concept.
Figure 13:
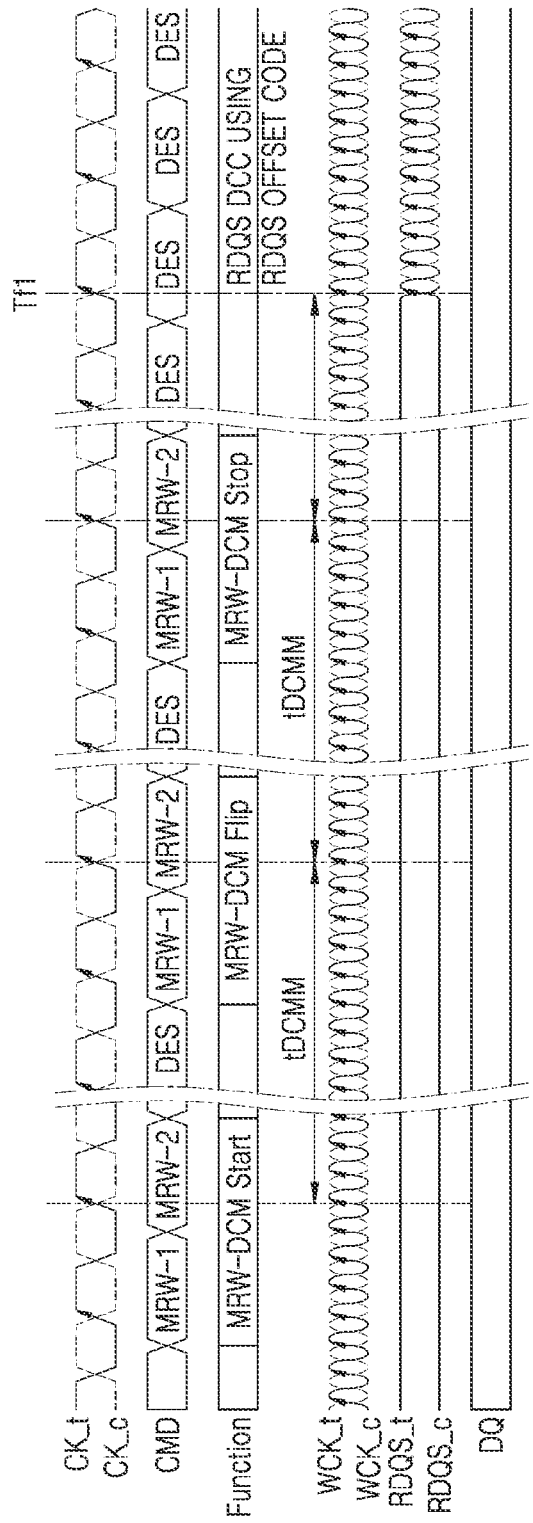

FIGS. 12 and 13 are respective diagrams illustrating a clock training method according to embodiments of the inventive concept in the context of the memory device 120 of FIG. 1, assuming that an RDQS offset code RDQS_OFF-SET has already been provided during a test operation or an initialization operation.

Here, FIG. 12 is a flowchart summarizing a clock training method performed while the memory device 120 is connected within the apparatus 100 of FIG. 1, and FIG. 13 is a timing diagram related to the clock training method of FIG. 12. The operations of FIGS. 12 and 13 may be used with any combination of the embodiments previously described with reference to FIGS. 1 through 11, inclusive. For example, a command may be issued by the memory controller 110 to the memory device 120 to perform the operation(s) described hereafter. For brevity, details regarding a particular command and details related to the issuing of the particular command are deemed to fall within the state of the art and are therefore omitted to preserve descriptive clarity.

Referring to FIG. 12, the memory device 120 may perform a DCM operation on a WCK clock by using the first DCM circuit 352, to provide information necessary for the memory controller 110 to read a DCM result on the WCK clock (S1210). The DCM operation of operation S1210 may start as the memory controller 110 issues mode register write commands MRW-1 and MRW-2 to the memory device 120, as illustrated in FIG. 13. The memory controller 110 may wait for the time tDCMM for the first DCM circuit 352 to complete measuring a WCK duty cycle. The memory controller 110 may issue the mode register write commands MRW-1 and MRW-2 to flip an input of the first DCM operation S910 to switch OP[1] code of the second mode register 122b. The memory controller 110 may wait for the time tDCMM for the first DCM circuit 352 to complete WCK duty cycle measurement with the flipped inputs. The memory controller 110 may exit from the first DCM operation (S1210) by issuing the mode register write commands MRW-1 and MRW-2. When escaping the first DCM operation (S1210), a current DCM result may be automatically captured when OP[1] of the second mode register 122b is logic low, and stored in OP[2]/OP[4] of the second mode register 122b, and a current DCM result may be automatically captured when OP[1] of the second mode register 122b is logic high, and stored in OP[3]/OP[5] of the second mode register 122b. The DCM result stored in OP[5:2] of the second mode register 122b may be provided to the memory controller 110 by an MMR command issued by the memory controller 110.

The memory controller 110 may provide a timing-adjusted WCK clock based on the DCM result of the DCM operation (S1210) on the WCK clock. The memory device 120 may correct the RDQS duty cycle based on the RDQS offset code RDQS_OFFSET stored in the storage circuit 366 (S1220). As illustrated in FIG. 13, the RDQS duty cycle may be corrected based on the RDQS offset code RDQS_OFF-SET based on the WCK clock timing adjusted at time Tf1. Here, it will be understood that the RDQS duty cycle correction operation is performed without the RDQS training operation (S920) described in FIG. 9.

Figure 14:
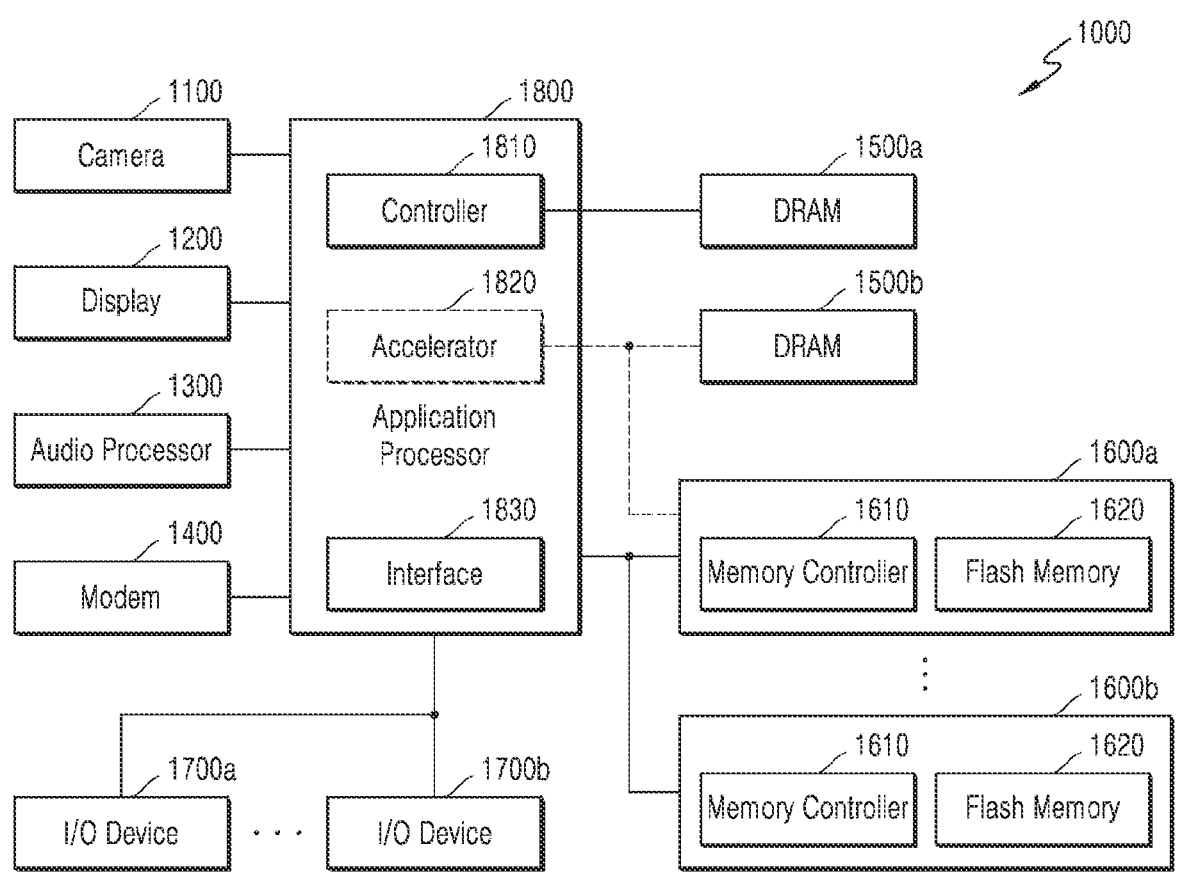
FIG. 14 is a block diagram illustrating a system to which a clock training method according to embodiments of the inventive concept may be applied.

FIG. 14 is a block diagram illustrating a system 1000 to which the clock training method according to the embodiments of the inventive may be applied.

Referring to FIG. 14, the system 1000 may include a camera 1100, a display 1200, an audio processor 1300, a modem 1400, DRAMs 1500a and 1500b, and flash memories 1600a and 1600b, I/O devices 1700a and 1700b, and an AP 1800. The system 1000 may be implemented using a laptop computer, a mobile phone, a smart phone, a tablet PC, a wearable device, a healthcare device, or an IoT device. The system 1000 may also be implemented using a server or a personal computer.

The camera 1100 may capture a still image or a moving picture according to the control by a user, and may store the captured image or moving pictures or transmit the same to the display 1200. The audio processor 1300 may process audio data included in the flash memories 1600a and 1600b or content of a network. The modem 1400 may modulate and transmit a signal to transmit/receive wired/wireless data, and may demodulate a modulated signal to restore the same to an original signal at the receiving end. The I/O devices 1700a and 1700b may include devices for providing digital input and/or output functions, such as a Universal Serial Bus (USB) or storage, a digital camera, a Secure Digital (SD) card, a Digital Versatile Disc (DVD), a network adapter, and a touch screen.

The AP 1800 may control the overall operation of the system 1000. The AP 1800 may control the display 1200 such that a portion of content stored in the flash memories 1600a and 1600b is displayed on the display 1200. When a user input is received through the I/O devices 1700a and 1700b, the AP 1800 may perform a control operation corresponding to the user input. The AP 1800 may include an accelerator block, which is a dedicated circuit for artificial intelligence (AI) data operation, or may include an accelerator chip 1820 separately from the AP 1800. The DRAM 1500b may be additionally mounted to an accelerator block or the accelerator chip 1820. The accelerator is a functional block that professionally performs a specific function of the AP 1800, and the accelerator may include a GPU, which is a functional block that professionally performs graphic data processing, a neural processing unit (NPU), which is a block that professionally performs AI computation and inference, and a data processing unit (DPU), which is a block that professionally performs data transmission.

The system 1000 may include a plurality of DRAMs 1500a and 1500b. The AP 1800 may control the DRAMs 1500a and 1500b through a command and mode register (MRS) setting conforming to the Joint Electron Device Engineering Council (JEDEC) standard, or may set DRAM interface protocols and perform communication to use company-specific functions such as low voltage/high speed/reliability and Cyclic Redundancy Check (CRC) or Error Correction Code (ECC) function. For example, the AP 1800 may communicate with the DRAM 1500a through an interface conforming to the JEDEC standards such as LPDDR4 and LPDDR5, and the accelerator block or the accelerator chip 1820 may establish a new DRAM interface protocol and perform communication to control the DRAM 1500b for accelerators, which has a higher bandwidth than the DRAM 1500a.

In the illustrated example of FIG. 14, only the DRAMs 1500a and 1500b are shown, but the inventive concept is not limited thereto, and when bandwidth, response speed, and voltage conditions of the AP 1800 or accelerator chip 1820 are satisfied, any memory including (e.g.) PRAM, SRAM, MRAM, RRAM, FRAM or Hybrid RAM memory may be used. The DRAMs 1500a and 1500b have relatively smaller latency and bandwidth than the I/O devices 1700a and 1700b or the flash memories 1600a and 1600b. The DRAMs 1500a and 1500b may be initialized when the system 1000 is powered on, loaded with an operating system and application data, and may be used as temporary storage locations for the operating system and application data or as execution space for various software codes.

In the DRAMs 1500a and 1500b, the four fundamental arithmetic operations, that is, addition/subtraction/multiplication/division operations, vector operations, address operations, or Fast Fourier Transform (FFT) operations may be performed. Also, a function for performing an inference may be performed in the DRAMs 1500a and 1500b. Here, inference may be performed in a deep learning algorithm using an artificial neural network. The deep learning algorithm may include a training operation of learning a model through various data and an inference operation of recognizing data with the trained model. According to an embodiment, an image captured by a user using the camera 1100 may be signal-processed and stored in the DRAM 1500b, and the accelerator block or the accelerator chip 1820 may perform AI data operation for recognizing data by using data stored in the DRAM 1500b and a function used for inference.

The system 1000 may include a plurality of storages or a plurality of flash memories) 1600a and 1600b having a larger capacity than the DRAMs 1500a and 1500b. The accelerator block or the accelerator chip 1820 may perform a training operation and AI data operation by using the flash memory devices 1600a and 1600b. In an embodiment, the flash memories 1600a and 1600b may efficiently perform a training operation and inference AI data operation, performed by the AP 1800 and/or the accelerator chip 1820, by using a computing device included in the memory controller 1610. The flash memories 1600a and 1600b may store photographic images taken using the camera 1100 or data transmitted through a data network. For example, the flash memories 1600a and 1600b may store augmented reality/virtual reality, High Definition (HD), or Ultra High Definition (UHD) content.

The system 1000 may simultaneously perform first clock training and second clock training to reduce the clock training time between components, generate a clock offset code by calculating an offset of a second clock with respect to a first clock, and correct a duty error of the second clock by using the clock offset code. The camera 1100, the display 1200, the audio processor 1300, the modem 1400, the DRAMs 1500a and 1500b, the flash memories 1600a and 1600b, the I/O devices 1700a and 1700b in the system 1000 may partially or entirely combine the embodiments described with reference to FIGS. 1 through 13.

While the inventive concept has been particularly shown and described with reference to embodiments thereof, it will be understood that various changes in form and details may be made therein without departing from the spirit and scope of the following claims.

What is claimed is:

1. A memory device comprising:
a first signal pin configured to receive a data clock;
a second signal pin configured to transmit a read clock; and
a data clock circuit receiving the data clock and configured to
perform first duty cycle monitoring that monitors a duty cycle of the data clock, generates a first result, and provides a timing-adjusted data clock in response to the first duty cycle monitoring,
perform second duty cycle monitoring that monitors a duty cycle of the read clock, generates a second result, and provides a timing-adjusted read clock in response to the second duty cycle monitoring,
calculate an offset of the read clock in response to the timing-adjusted data clock, the first result and the second result, and
correct a duty error of the read clock using a read clock offset code derived in relation to the offset of the read clock,
wherein the data clock controls data write timing during a write operation executed by the memory device,
the data clock controls data read timing during a read operation executed by the memory device, and
the read clock controls communication of read data from the memory device.

2. The memory device of claim 1, wherein the first duty cycle monitoring and the second duty cycle monitoring are performed in parallel.

3. The memory device of claim 1, wherein the data clock circuit is further configured to provide the first result and the second result corresponding to respective steps of a duty cycle adjustment code indicating an adjustment range of a duty cycle adjuster.

4. The memory device of claim 3, wherein the data clock circuit is further configured to provide the first result with respect to input conditions for non-flipping and flipping of the data clock, and provide the second result with respect to input conditions for non-flipping and flipping of the read clock.

5. The memory device of claim 1, wherein the data clock circuit comprises:
   a duty cycle adjuster configured to receive the data clock and provide the timing-adjusted data clock in relation to the first result;
   a first duty cycle monitoring circuit configured to provide the first result by monitoring a duty cycle of the timing-adjusted data clock; and
   a duty cycle corrector configured to provide the read clock offset code in relation to a difference value between the first result and the second result.

6. The memory device of claim 5, wherein the duty cycle corrector comprises:
   a second duty cycle monitoring circuit configured to receive the read clock and provide the second result by performing the second duty cycle monitoring;
   a logic circuit configured to generate the read clock offset code by subtracting a bit value of the first result and a bit value of the second result; and
   a storage circuit configured to store the read clock offset code.

7. The memory device of claim 6, wherein the storage circuit includes at least one of a register and an anti-fuse.

8. The memory device of claim 1, further comprising:
   a third signal pin configured to communicate read/write data and connected to a write data path and a read data path,
   wherein the first result is related to the write data path, and the second result is related to the read data path.

9. An apparatus comprising:
   a host, and
   a memory device connected to the host through a bus,
   wherein the bus includes a clock bus portion configured to communicate a data clock controlling data write timing during a write operation executed by the memory device, and a read clock controlling data read timing during a read operation executed by the memory device, and
   the memory device is configured to
      perform first duty cycle monitoring that monitors a duty cycle of the data clock, generates a first result, and provides a timing-adjusted data clock,
      perform second duty cycle monitoring that monitors a duty cycle of the read clock, generates a second result, and provides a timing-adjusted read clock,
      calculate an offset of the read clock based on the timing-adjusted data clock, the result and the second result, and
      correct a duty error of the read clock using a read clock offset code derived from the offset of the read clock.

10. The apparatus of claim 9, wherein the memory device is further configured to perform the first duty cycle monitoring and the second duty cycle monitoring in parallel.

11. The apparatus of claim 9, wherein the memory device is further configured to provide the first result and the second result respectively corresponding to steps of a duty cycle adjuster code indicating an adjustment range of a duty cycle adjuster operating on the data clock.

12. The apparatus of claim 11, wherein the memory device is further configured to provide the first result with respect to input conditions for non-flipping and flipping of the data clock, and the second result with respect to input conditions for non-flipping and flipping of the read clock.

13. The apparatus of claim 12, wherein the memory device is further configured to generate the read clock offset code in response to the first result and the second result according to a non-flipping setting of the data clock and the read clock.

14. The apparatus of claim 12, wherein the memory device is further configured to generate the read clock offset code in response to the first result and the second result according to a flipping setting of the data clock and the read clock.

15. The apparatus of claim 9, wherein the host is a memory controller and the memory device is further configured to provide the first result to the memory controller.

16. The apparatus of claim 15, wherein the memory device is further configured to provide the read clock offset code to the memory controller.

17. The apparatus of claim 9, wherein the host is a testing host and the memory device is further configured to provide the first result to the testing host.

18. The apparatus of claim 17, wherein the memory device is further configured to provide the read clock offset code to the testing host.

19. An apparatus comprising:
   a memory controller; and
   a memory device connected to the memory controller by a bus, wherein the memory device receives a data clock from the memory controller via the bus and the memory controller receives a read clock from the memory device via the bus,
   the data clock controls data write timing during a write operation executed by the memory device and the read clock controls read timing during a read operation executed by the memory device,
   the memory device is configured to perform first duty cycle monitoring that monitors a duty cycle of the data clock and generates a first result, provide a timing-adjusted data clock in response to the first duty cycle monitoring, generate a read clock offset code in response to the first result, and correct a duty error of the read clock using the read clock offset code, and
   the read clock offset code indicates a difference between a first propagation delay associated with a write data path used to communicate data from the memory controller to the memory device and a second propagation delay associated with a read data path used to communicate data from the memory device to the memory controller.

20. The apparatus of claim 19, wherein the memory device is further configured to perform second duty cycle monitoring that monitors a duty cycle of the read clock and generates a second result, provide a timing-adjusted read clock in response to the second duty cycle monitoring, and further generate the read clock offset code in response to the second result.

* * * * *